United States Patent
Ito (10) Patent No.: US 9,621,184 B2
(45) Date of Patent: Apr. 11, 2017

(54) ΔΣ D/A CONVERTER, SIGNAL PROCESSING CIRCUIT INCLUDING THE SAME, AND ELECTRONIC APPARATUS (71) Applicant: ROHM CO., LTD., Ukyo-ku, Kyoto (JP)

(72) Inventor: Kinji Ito, Ukyo-ku (JP)

(73) Assignee: ROHM CO., LTD, Kyoto (JP)

( * ) Notice: Subject to any disclaimer, the term of this patent is extended or adjusted under 35 U.S.C. 154(b) by 58 days.

(21) Appl. No.: 14/674,523

(22) Filed: Mar. 31, 2015

(65) Prior Publication Data
US 2015/0280735 A1    Oct. 1, 2015

(30) Foreign Application Priority Data

Apr. 1, 2014  (JP) ................. 2014-075757

(51) Int. Cl.
| | | |
|---|---|---|
| *H04R 29/00* | (2006.01) | |
| *H03M 3/00* | (2006.01) | |
| *H03M 1/06* | (2006.01) | |
| *H04R 3/00* | (2006.01) | |
| *H03M 7/30* | (2006.01) | |

(52) U.S. Cl.
CPC ......... *H03M 3/502* (2013.01); *H03M 1/0631* (2013.01); *H03M 3/368* (2013.01); *H04R 3/00* (2013.01); *H03M 7/3037* (2013.01); *H04R 2499/13* (2013.01)

(58) Field of Classification Search
None
See application file for complete search history.

(56) References Cited

U.S. PATENT DOCUMENTS

| | | | | | |
|---|---|---|---|---|---|
| 5,087,914 | A | * | 2/1992 | Sooch ................... | H03M 3/384 341/118 |
| 5,592,165 | A | * | 1/1997 | Jackson ................ | H03M 3/504 341/120 |
| 2004/0189503 | A1 | * | 9/2004 | Melanson ............. | H03M 3/372 341/152 |
| 2016/0072520 | A1 | * | 3/2016 | Pagnanelli ............ | H03M 3/468 341/143 |
| 2016/0205471 | A1 | * | 7/2016 | Yasuda ................ | H04R 17/005 381/100 |

FOREIGN PATENT DOCUMENTS

JP    2012023616 A    2/2012

OTHER PUBLICATIONS

Steven R. Norsworthy, "Delta-Sigma Data Converters Theory, Design, and Simulation", IEEE Press, 1996, p. 309-332, 380-405.

* cited by examiner

*Primary Examiner* — Muhammad N Edun
(74) *Attorney, Agent, or Firm* — Cantor Colburn LLP (57) ABSTRACT

A ΔΣ D/A converter for converting a digital input data to an analog output signal, includes: a ΔΣ modulator configured to generate a first data by ΔΣ-modulating the digital input data; a digital filter configured to generate a second data by smoothing the first data; and a D/A converter configured to convert the second data to the analog output signal.

8 Claims, 8 Drawing Sheets

ΔΣ D/A CONVERTER, SIGNAL PROCESSING CIRCUIT INCLUDING THE SAME, AND ELECTRONIC APPARATUS

CROSS-REFERENCE TO RELATED APPLICATION

This application is based upon and claims the benefit of priority from Japanese Patent Application No. 2014-075757, filed on Apr. 1, 2014, the entire contents of which are incorporated herein by reference.

TECHNICAL FIELD

The present disclosure relates to a ΔΣD/A converter.

BACKGROUND

Figure 1A:
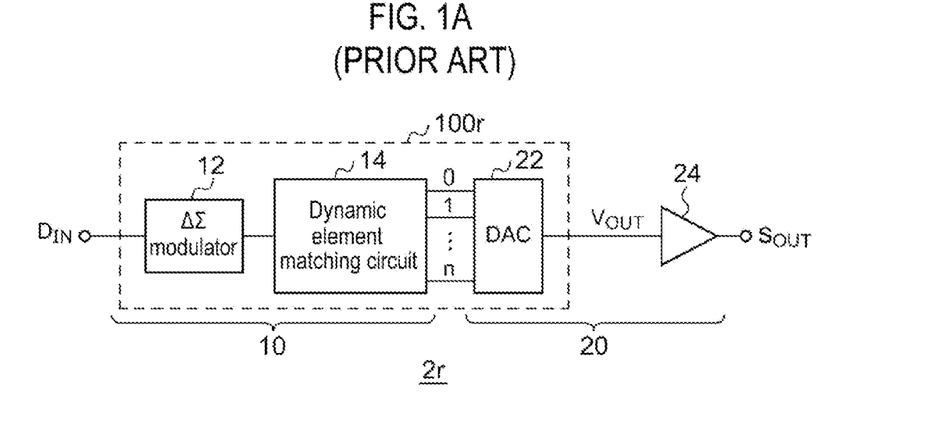
FIG. 1A is a circuit block diagram of a signal processing circuit including a $\Delta\Sigma$ D/A converter.

A ΔΣ D/A converter is known as an example of a D/A converter for converting a digital signal to an analog signal. FIG. 1A is a block diagram of a signal processing circuit 2r including a ΔΣ D/A converter. The ΔΣ D/A converter 100r includes a ΔΣ modulator 12, a dynamic element matching circuit 14 and a D/A converter 22. The ΔΣ modulator 12 ΔΣ-modulates an input digital data $D_{IN}$. The D/A converter 22 converts a digital data output from the ΔΣ modulator 12, which has a gradation level from n+1 (0 to n) levels, to an analog voltage $V_{OUT}$ having a corresponding gradation level from corresponding n+1 (0 to n) levels.

Figure 1B:
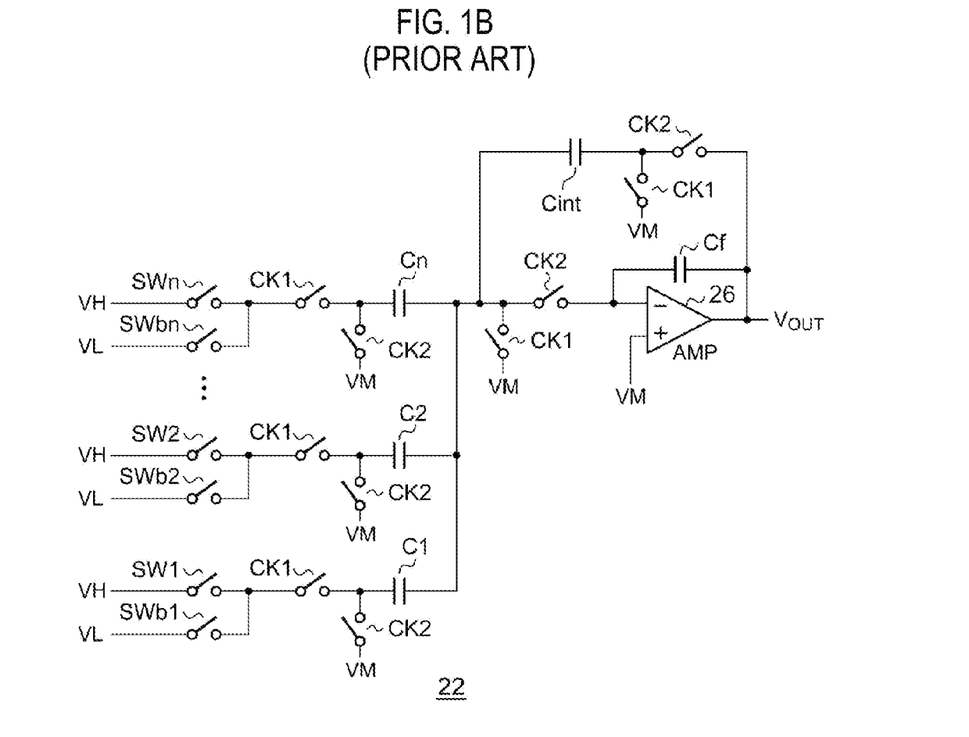
FIG. 1B is a circuit diagram of the D/A converter of a switched capacitor type used in FIG. 1A

FIG. 1B is a circuit diagram of the D/A converter 22 of a switched capacitor type, which is used in FIG. 1A. The D/A converter 22 includes n capacitors C1 to Cn, a plurality of switches CK1, CK2, SW1 to SWn and SWb1 to SWbn, an operational amplifier 26 and capacitors Cint and Cf. The n capacitors C1 to Cn have the same capacitance.

The D/A converter 22 alternates between a first state φ1 and a second state φ2 in synchronization with a clock. The switch CK1 is turned on in the first state φ1 and turned off in the second state φ2. The switch CK2 is turned on in the second state φ2 and turned off in the first state φ1.

Assuming that an input value to the D/A converter 22 is x, among the n switches SW1 to SWn, x switches are turned on and the remaining (n-x) switches are turned off. An $i^{th}$ (1 ≤i≤n) complementary switch SWbi operates in a complementary fashion to the corresponding switch SWi. At this time, in the first state φ1, x capacitors C1 are charged at a high level voltage VH-VM and the remaining (n-x) capacitors are charged at a low level voltage VL-VM. Subsequently, in the second state φ2, the n capacitors C1 to Cn are connected to the capacitors Cint and Cf. At this time, according to the conservation law of charge, an output voltage $V_{OUT}$ of the operational amplifier 26 is a voltage proportional to the number x of selected switches SW.

Returning to FIG. 1A, the dynamic element matching circuit 14 selects the x switches SW, which are to be turned on, in accordance to data output from the ΔΣ modulator 12. In an actual D/A converter 22, capacitances and switch impedances are not uniform. In order to eliminate this non-uniformity, the dynamic element matching circuit 14 dynamically switches cells (combinations of capacitors and switches) used cyclically or randomly. The dynamic element matching contributes to prevention of heat from concentrating at a certain portion in the D/A converter 22 and also to noise reduction.

Figure 1C:
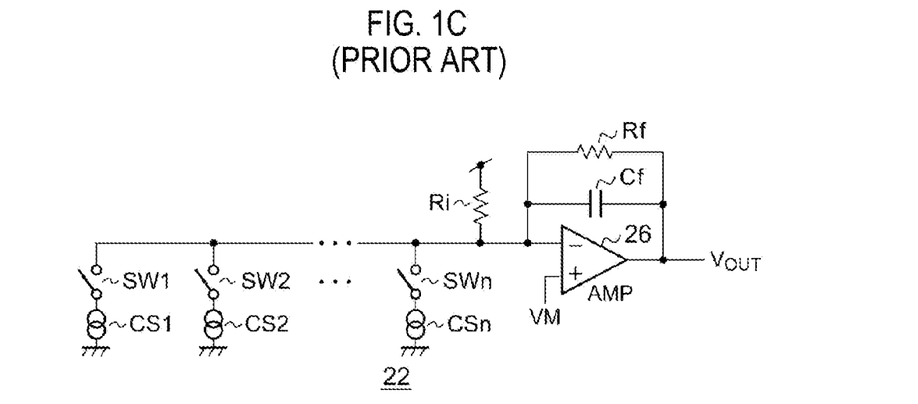
FIG. 1C is a circuit diagram of the D/A converter of a current segment type used in FIG. 1A.

Instead of the switched capacitor type, a current segment type, which is illustrated in FIG. 1C, may be used as the D/A converter 22. In this case, the D/A converter 22 includes a plurality of switches SW1 to SWn, a plurality of current sources CS1 to CSn, resistors Ri and Rf, a capacitor Cf and an operational amplifier 26. Assuming that an input value to the D/A converter 22 is x, among the n switches SW1 to SWn, x switches are turned on and the remaining (n-x) switches are turned off. Assuming that a unit current generated by one current CS is Ic, a voltage drop of the resistor Ri is Ri×Ic×x, which is in proportion to the input value x. The operational amplifier 26 inverts and amplifies the voltage of the resistor Ri. An output voltage $V_{OUT}$ of the operational amplifier 26 is a voltage proportional to the number x of selected switches SW.

An analog signal processing circuit 24 such as an amplifier or the like is provided in the subsequent stage of the D/A converter 22. In the signal processing circuit 2r, the ΔΣ modulator 12 and the dynamic element matching circuit 14 form a digital part 10, and the D/A converter 22 and the analog signal processing circuit 24 form an analog part 20.

Figure 2:
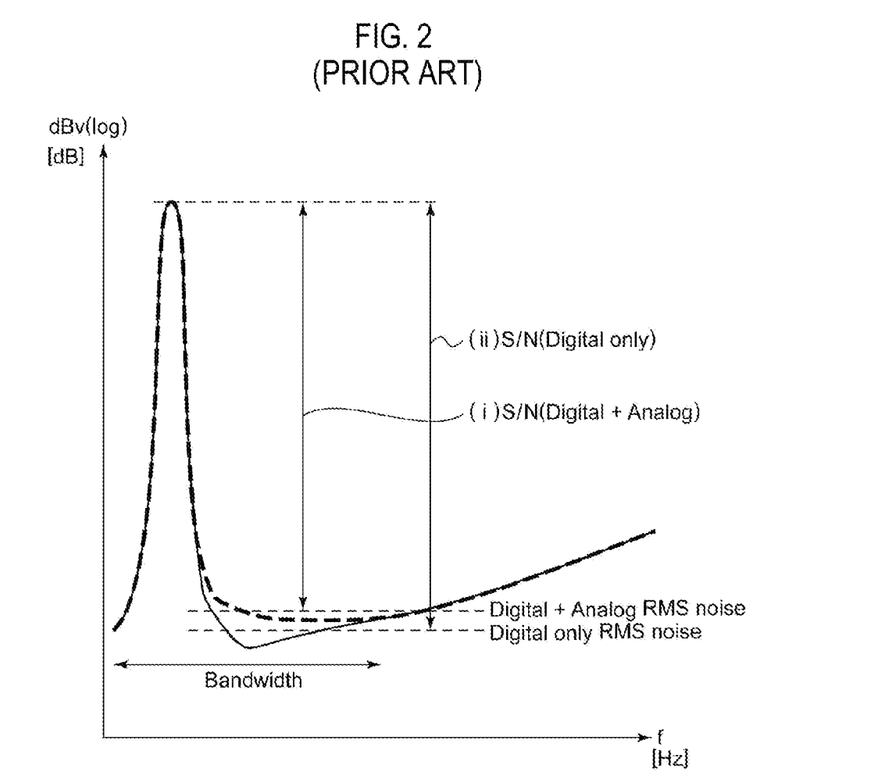
FIG. 2 is a graphical view showing noise characteristics of the $\Delta\Sigma$ D/A converter of FIG. 1A.

The present inventor has studied the signal processing circuit 2r of FIG. 1A and has come to recognize the following problems. FIG. 2 is a graphical view showing noise characteristics of the ΔΣ D/A converter 100r of FIG. 1A. A solid line indicates a spectrum of the digital part 10. As for the spectrum of the digital part 10, a noise component is pushed away outside a signal band due to oversampling and noise shaping according to the ΔΣ modulation.

FIG. 2 shows a noise floor level of the digital part 10 and a noise floor level of the analog part 20. A dashed line indicates a spectrum of the entire signal processing circuit 2r including the digital part 10 and the analog part 20. An S/N ratio (i) of the entire signal processing circuit 2r is worse than the theoretical S/N ratio (ii) of only the digital part 10 by the noise floor of the analog part 20.

SUMMARY

The present disclosure provides some embodiments of a ΔΣ D/A converter, which is capable of improving an S/N ratio of the entire signal processing circuit.

According to an aspect of the present disclosure, there is provided a ΔΣ D/A converter for converting a digital input data to an analog output signal. The ΔΣ D/A converter includes a ΔΣ modulator configured to generate a first data by ΔΣ-modulating the digital input data; a digital filter configured to generate a second data by smoothing the first data; and a D/A converter configured to convert the second data to the analog output signal.

The first data generated by the ΔΣ modulator has a peak of a very high frequency component. The peak is removed from the first data by the digital filter and thus, the theoretical S/N ratio of a digital part is deteriorated. However, signal amplitude S of an analog part is magnified by magnifying the amplitude of the second data. Accordingly, when a noise floor of the analog part is dominant, the S/N ratio of the entire signal processing circuit can be improved.

The digital filter may be configured to be switchable between an active state and an inactive state. If the digital filer is switched to the inactive state, the digital filter may output the first data as the second data. The ΔΣ modulator may include a quantizer provided in an output stage of the ΔΣ modulator. The quantizer may be configured so that a number of gradation levels of the quantizer can be changed, depending on a state of the digital filter. The digital filter may be turned on if the noise level of the analog part in the subsequent stage of the ΔΣ D/A converter is large and may be turned off if the noise level of the analog part is small so that a high S/N ratio can be achieved in various circumferences.

The digital filter may include a FIR digital filter with k stages (k is a natural number), each of which has a coefficient of 1.

The number of stages of the FIR digital filter may be changeable.

A plurality of selectable analog signal paths may be provided in a subsequent stage of the $\Delta\Sigma$ D/A converter. An operation of the digital filter may vary depending on a selected path among the plurality of selectable analog signal paths.

The $\Delta\Sigma$ D/A converter may further include an amplitude fine adjusting unit that is provided in a front stage of the $\Delta\Sigma$ modulator and finely adjusts amplitude of the digital input data. With this configuration, the amplitude of the input data of the D/A converter 22 can be maximized within a range where no signal distortion is generated in the D/A converter 22, which results in further improvement of the S/N ratio.

The digital input data may be an audio signal.

According to another aspect of the present disclosure, there is provided a signal processing circuit 2 including: the above-described $\Delta\Sigma$ D/A converter configured to convert a digital audio signal to an analog audio signal; and an analog signal processing circuit configured to subject an output signal of the $\Delta\Sigma$ D/A converter to a predetermined signal processing.

According to still another aspect of the present disclosure, there is provided an electronic apparatus including the above-described signal processing circuit.

Any combinations of the above-described elements or changes of the representations of the present disclosure between methods and apparatuses are effective as embodiments of the present disclosure.

DETAILED DESCRIPTION

Embodiments of the present disclosure will now be described with reference to the drawings. Throughout the drawings, the same or equivalent components, members, and processes are denoted by the same reference numerals and a repeated description thereof will be properly omitted. Also, the disclosed embodiments are merely examples and do not limit the present disclosure, and any feature or combination thereof described in the embodiments may not necessarily be essential to the present disclosure.

In the present disclosure, "a state in which a member A is connected to a member B" includes not only a case in which the member A and the member B are physically directly connected but also a case in which the member A and the member B are indirectly connected via any other member that does not affect an electrical connection state thereof.

Similarly, "a state in which a member C is installed between a member A and a member B" includes not only a case in which the member A and the member C or the member B and the member C are directly connected but also a case in which the member A and the member C or the member B and the member C are indirectly connected through any other member that does not affect an electrical connection state therebetween.

Figure 3:
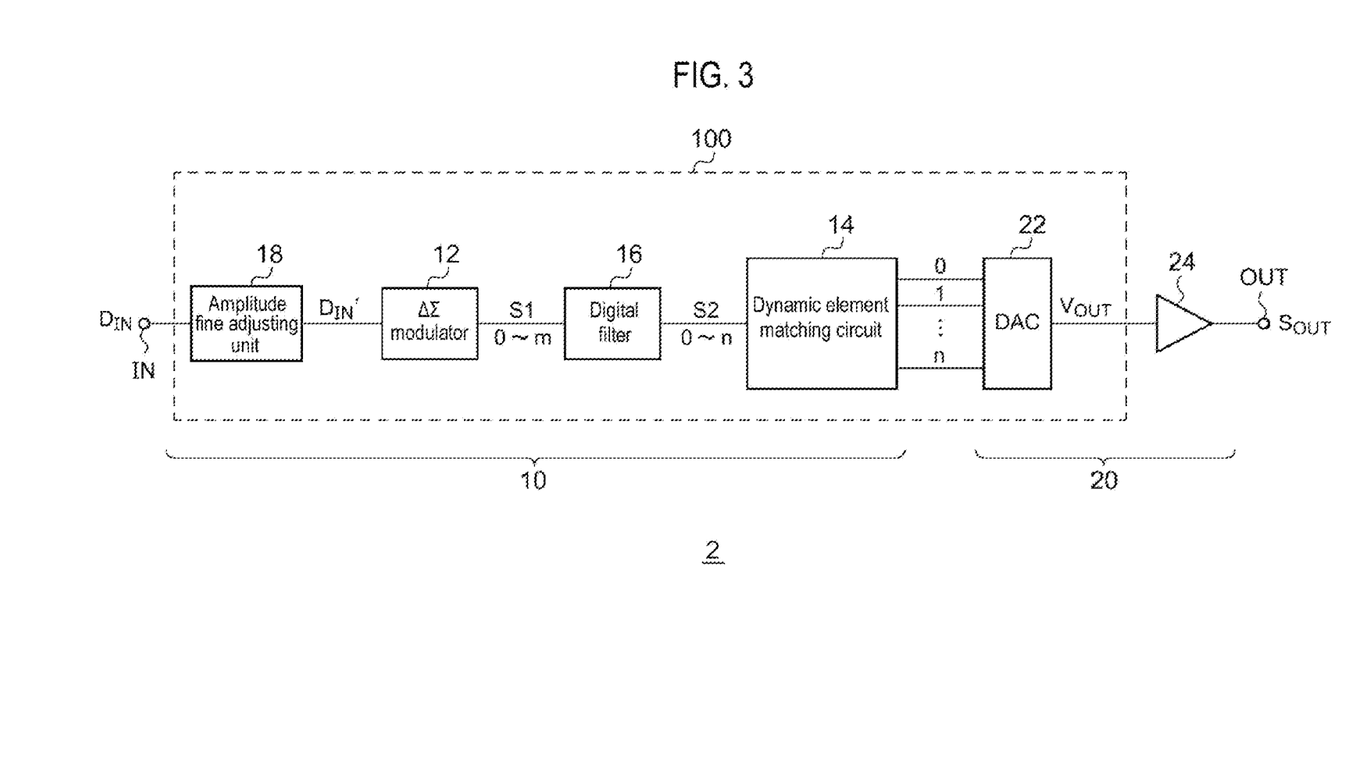
FIG. 3 is a circuit block diagram of a signal processing circuit including a $\Delta\Sigma$ D/A converter according to an embodiment.

FIG. 3 is a block diagram of a signal processing circuit 2 including a $\Delta\Sigma$ D/A converter 100 according to an embodiment. The signal processing circuit 2 includes the $\Delta\Sigma$ D/A converter 100 and an analog signal processing circuit 24. The $\Delta\Sigma$ D/A converter 100 converts digital input data $D_{IN}$ input to an input terminal IN to an analog output voltage $V_{OUT}$. The analog signal processing circuit 24 subjects the output voltage $V_{OUT}$ of the $\Delta\Sigma$ D/A converter 100 to predetermined signal processing and outputs an analog signal $S_{OUT}$ from an output terminal OUT. In the following description, for the purpose of easy understanding, it is assumed that the input data $D_{IN}$ is an audio signal and the signal processing circuit 2 is an audio signal processing circuit.

The input data $D_{IN}$ represents a 16 bit-audio waveform sampled at 48 kHz.

The $\Delta\Sigma$ D/A converter 100 includes a digital filter 16 and an amplitude fine adjusting unit 18, in addition to a $\Delta\Sigma$ modulator 12, a dynamic element matching circuit 14 and a D/A converter 22. The amplitude fine adjusting unit 18, the $\Delta\Sigma$ modulator 12, the digital filter 16 and the dynamic element matching circuit 14 form a digital part 10, and the D/A converter 22 and the analog signal processing circuit 24 form an analog part 20.

The $\Delta\Sigma$ modulator 12, the dynamic element matching circuit 14 and the D/A converter 22 are the same as described with reference to FIG. 1A. The D/A converter 22 of a switched capacitor type is provided with n input taps. In this embodiment, for example, n may be 16 or 32.

The amplitude fine adjusting unit 18 receives the input digital data $D_{IN}$ and finely adjusts an amplitude by multiplying a value of the data by a gain $\beta$. The amplitude fine adjusting unit 18 will be described in more detail later.

The $\Delta\Sigma$ modulator 12 generates a first data S1 by $\Delta\Sigma$-modulating the input digital data $D_{IN}'$, which is output from the amplitude fine adjusting unit 18. Specifically, the $\Delta\Sigma$ modulator 12 generates the first data S1 having a gradation level from m+1 (0 to m) levels, by oversampling and $\Delta\Sigma$-modulating the input digital data $D_{IN}'$. While in the signal processing circuit 2r of FIG. 1A, m is equal to n, in this embodiment, m is smaller than n.

The digital filter 16 generates a second data S2 by smoothing the first data S1. An output of the digital filter 16 is a gradation level from n+1 (0 to n) levels.

The D/A converter 22 of the switched capacitor type converts the second data S2, which is output from the digital filter 16, to the analog output voltage $V_{OUT}$ having a gradation level corresponding to the second data S2, from n+1 levels. The dynamic element matching circuit 14 is interposed between the D/A converter 22 and the digital filter 16 and dynamically switches cells of the D/A converter 22.

The D/A converter 22 may be configured as shown in FIG. 1B. In addition, the D/A converter 22 may be in a single-ended form or a differential form.

Figure 4A:
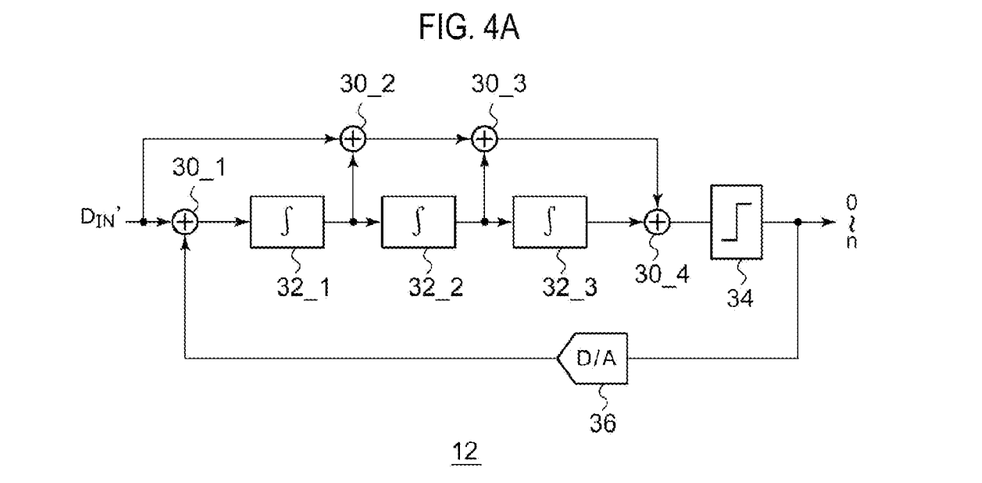
FIG. 4A is a view showing a configuration example of a $\Delta\Sigma$ modulator and FIG. 4B is a view showing a configuration example of a digital filter.

FIG. 4A shows a configuration example of the ΔΣ modulator 12 and FIG. 4B shows a configuration example of the digital filter 16. The ΔΣ modulator 12 includes adders 30_1 to 30_4, integrators 32_1 to 32_3, a quantizer 34 and a D/A converter 36. The configuration of the ΔΣ modulator 12 is well known in the art and, therefore, detailed explanation of which is omitted. The quantizer 34 quantizes its input value to m+1 (0 to m) gradation levels. The order of the ΔΣ modulator 12 is not particularly limited.

Figure 4B:
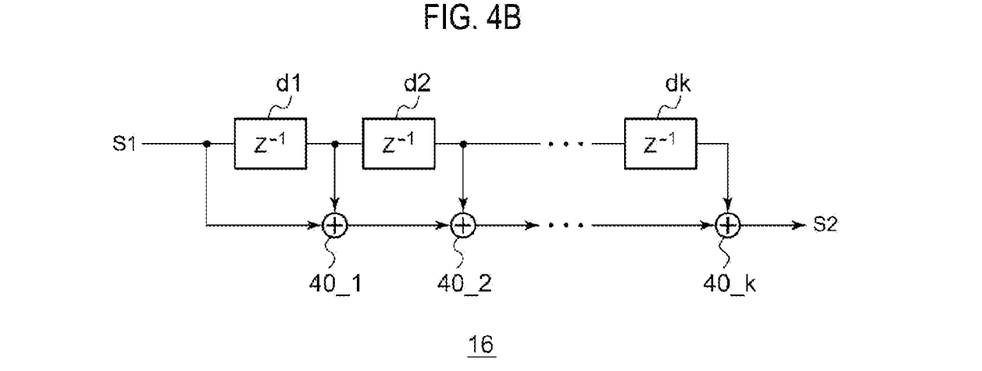

The digital filter 16 of FIG. 4B includes a plurality of delay elements d1 to dk and a plurality of adders 40_1 to 40_k. The digital filter 16 of FIG. 4B is a FIR type low pass filter in which a coefficient of each stage is 1. An $i^{th}$ delay element di (1≤i≤k) delays its input by one clock. An $i^{th}$ adder 40_i (1≤i≤k) adds an output of an $(i-1)^{th}$ adder 40_(i-1) and an output of the $i^r$ delay element di. For example, k may be 3 or 4.

The number of gradation levels m of the quantizer 34 is set to have a relationship of α×m≤n, where α is a gain of the digital filter 16. In order to make the theoretical S/N ratio of the digital part 10 as high as possible, it is preferable to maximize k within a range satisfying the relationship of α×m≤n.

$$m=\max(n/\alpha),$$

where max(x) represents the largest integer which does not exceed x.

When the digital filter 16 is composed of k stages, the maximum value of the gain α may he regarded as k. Therefore, th may be determined to be set to max(n/k). As one example, m=5 for 1=16 and k=3.

Figure 5A:
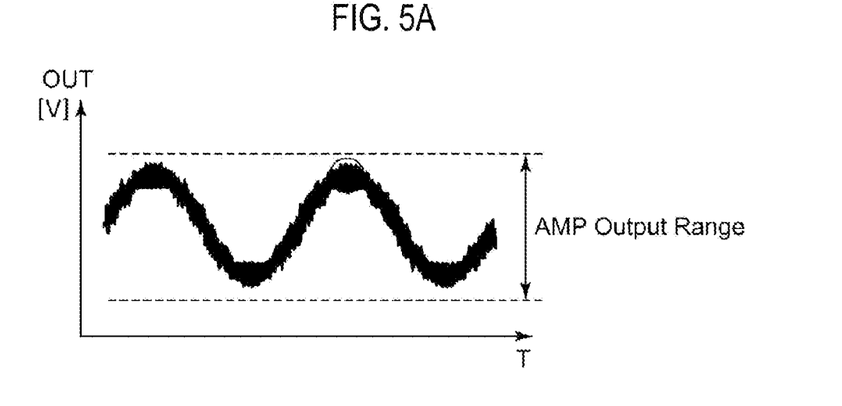
FIG. 5A is a waveform diagram of an analog signal representing an input data to the D/A converter and FIG. 5B is a waveform diagram showing output characteristics of the digital filter.
Figure 5B:
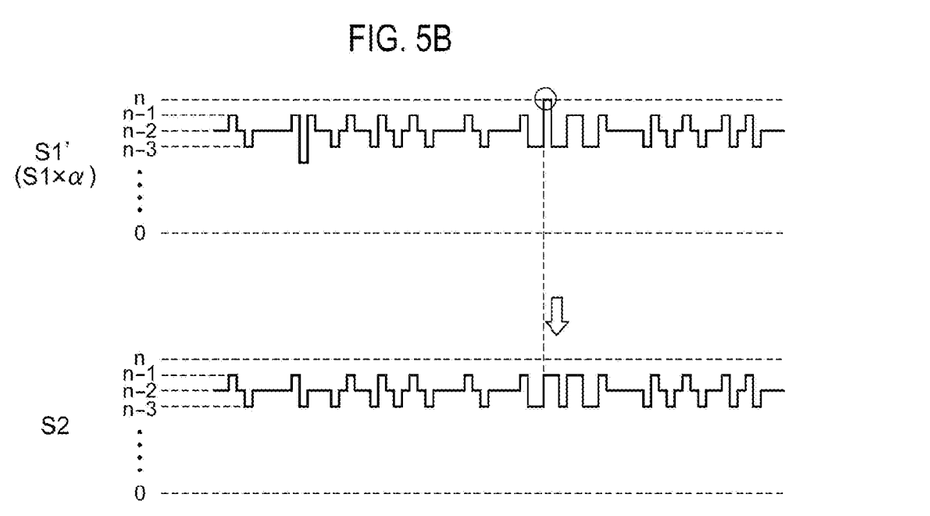

FIG. 5A is a waveform diagram of an analog signal representing an input data of the D/A converter 22. FIG. 5B is a waveform diagram showing output characteristics of the digital filter 16. Vertical and horizontal axes of time charts and waveform diagrams in the drawings are appropriately extended or reduced for the purpose of easy understanding. In addition, the waveforms shown herein are simplified or emphasized for the purpose of easy understanding. Since the output voltage $V_{OUT}$ of the D/A converter 22 is smoothed by the capacitor Cf of the output stage of the D/A converter 22, it has a waveform smoother than the waveform shown in FIG. 5A.

The upper part of FIG. 5B shows data S1' obtained by multiplying the first data S1 having a gradation level from (n+1) levels, which corresponds to the waveform surrounded by dashed lines in FIG. 5A and is input to the digital filter 16, by α. The lower part of FIG. 5B shows the second data S2. Sharp peaks included in the first data S1 are cut and smoothed by the digital filter 16. That is, the effective number of gradation levels of the second data S2 is decreased from (n+1) to (n+1-p) by the digital filter 16. Here, p is an integer. For example, for p=1, 17 gradation levels is decreased to 16 gradation levels.

Returning to FIG. 3, the amplitude fine adjusting unit 18 multiplies the input digital data $D_{IN}$ by a coefficient (or gain) β. The coefficient β is set to be as large as possible such that the maximum value of the second data S2 output from the digital filter 16 does not exceed the n level. The gain α of the digital filter 16 has substantially a precision of integer, whereas the gain β of the amplitude fine adjusting unit 18 has a precision of decimal.

The configuration of the signal processing circuit 2 has been described above. Subsequently, an operation thereof will be described.

Figure 6:
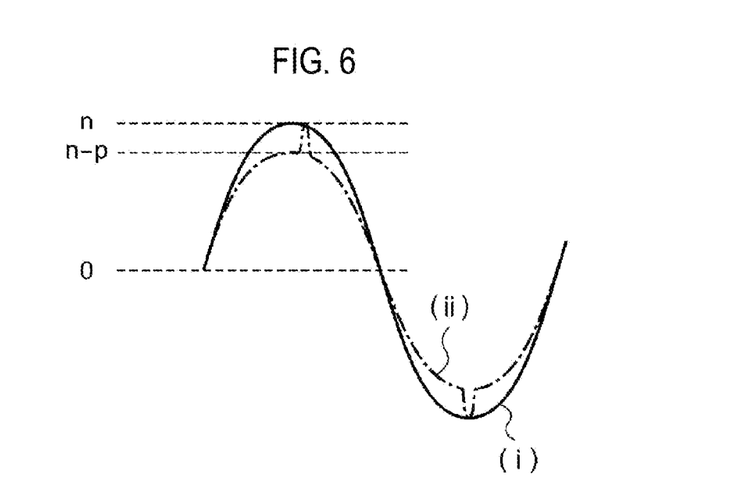
FIG. 6 is a waveform diagram of an output voltage of the signal processing circuit of FIG. 3.

FIG. 6 is a waveform diagram of an output voltage of the signal processing circuit 2 of FIG. 3. FIG. 6 also shows the output voltage of the signal processing circuit 2r of FIG. 1A, which is indicated by a dashed-dotted line (ii), for the purpose of comparison.

Referring first to the dashed-dotted line (ii), in the signal processing circuit 2r of FIG. 1A, the input of the D/A converter 22 has a peak. Therefore, the signal amplitude is so limited to fit this peak within the maximum gradation level n of the D/A converter 22.

In contrast, according to the signal processing circuit of FIG. 3, by providing the digital filter 16, the peak is removed from the input of the D/A converter 22, as indicated by a solid line (i). By optimizing the gain α of the digital filter 16 and the gain β of the amplitude fine adjusting unit 18 as much as the peak was removed, the amplitude of the input of the D/A converter 22 is magnified within a range which does not exceed the maximum gradation level n, thereby magnifying a signal component propagating in the analog part 20.

If the peak corresponding to one gradation level is cut by the digital filter 16, the amplitude of the signal component may be magnified up to n/(n-1) times. Thus, when a noise component in the analog part 20 is the same, the signal component relative to the noise component can be magnified, thereby increasing a S/N ratio.

Figure 7:
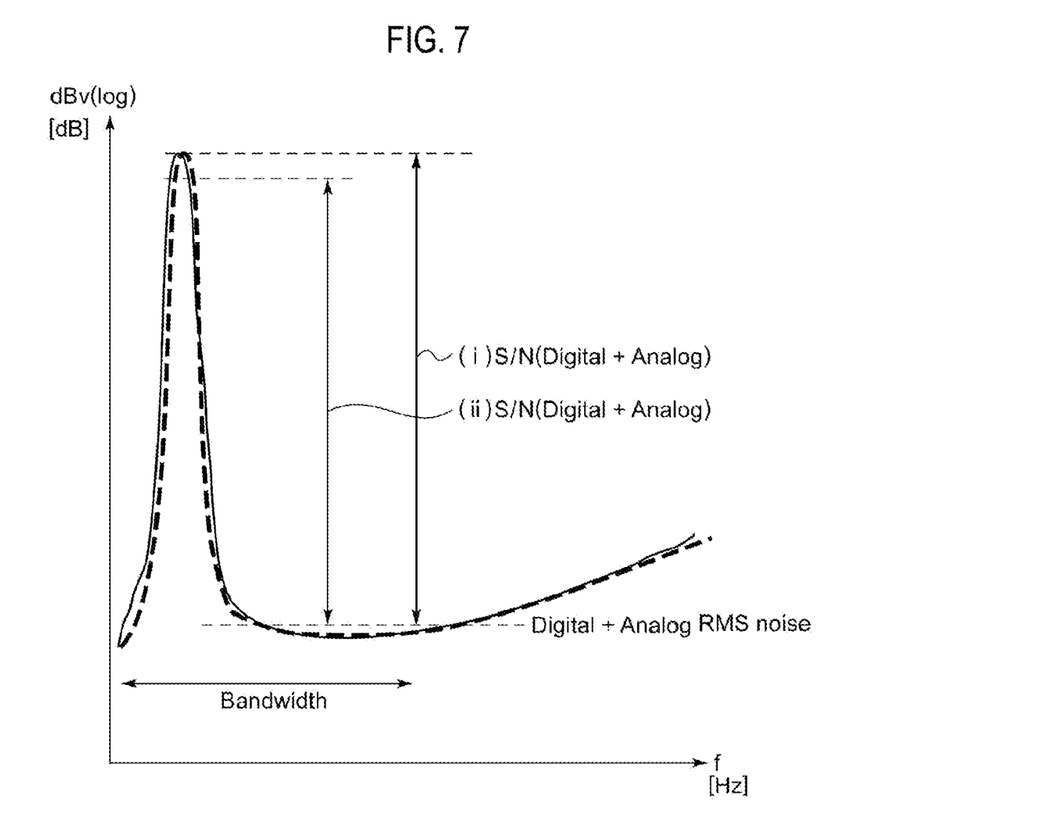
FIG. 7 is a graphical view showing noise characteristics of the signal processing circuit of FIG. 3.

FIG. 7 is a graphical view showing noise characteristics of the signal processing circuit 2 of FIG. 3. A solid line (i) indicates noise characteristics of the signal processing circuit 2 of FIG. 3 and a dashed line (ii) indicates noise characteristics of the signal processing circuit 2r of FIG. 1A. As can be seen from the solid line (i), as the signal component is magnified, the S/N ratio for the same noise level may be increased.

As one example, assume that the theoretical S/N ratio of the digital part 10 is 102 [dB] and the noise level is −98.1 [dB]. In this case, if the signal level input to the analog part 20 in the signal processing circuit 2r of FIG. 1A is −2.1 [dBv], the S/N ratio is 96 [dB]. In this regard, the theoretical S/N ratio of the digital part 10 in the signal processing circuit 2 of FIG. 3 is worsened to 98 [dB]. However, the signal level input to the analog part 20 is increased to −0.8 [dBv] and thus, the S/N ratio for the entire signal processing circuit 2 is 97.3 [dB], which is larger by 1.3 [dB] than that of FIG. 1A.

The present disclosure has been described above by way of embodiments. The disclosed embodiments are illustrative only. It should be understood by those skilled in the art that various modifications to combinations of elements or processes may be made and such modifications fall within the scope of the present disclosure. Such modifications will be described below.

(First Modification)

Figure 8:
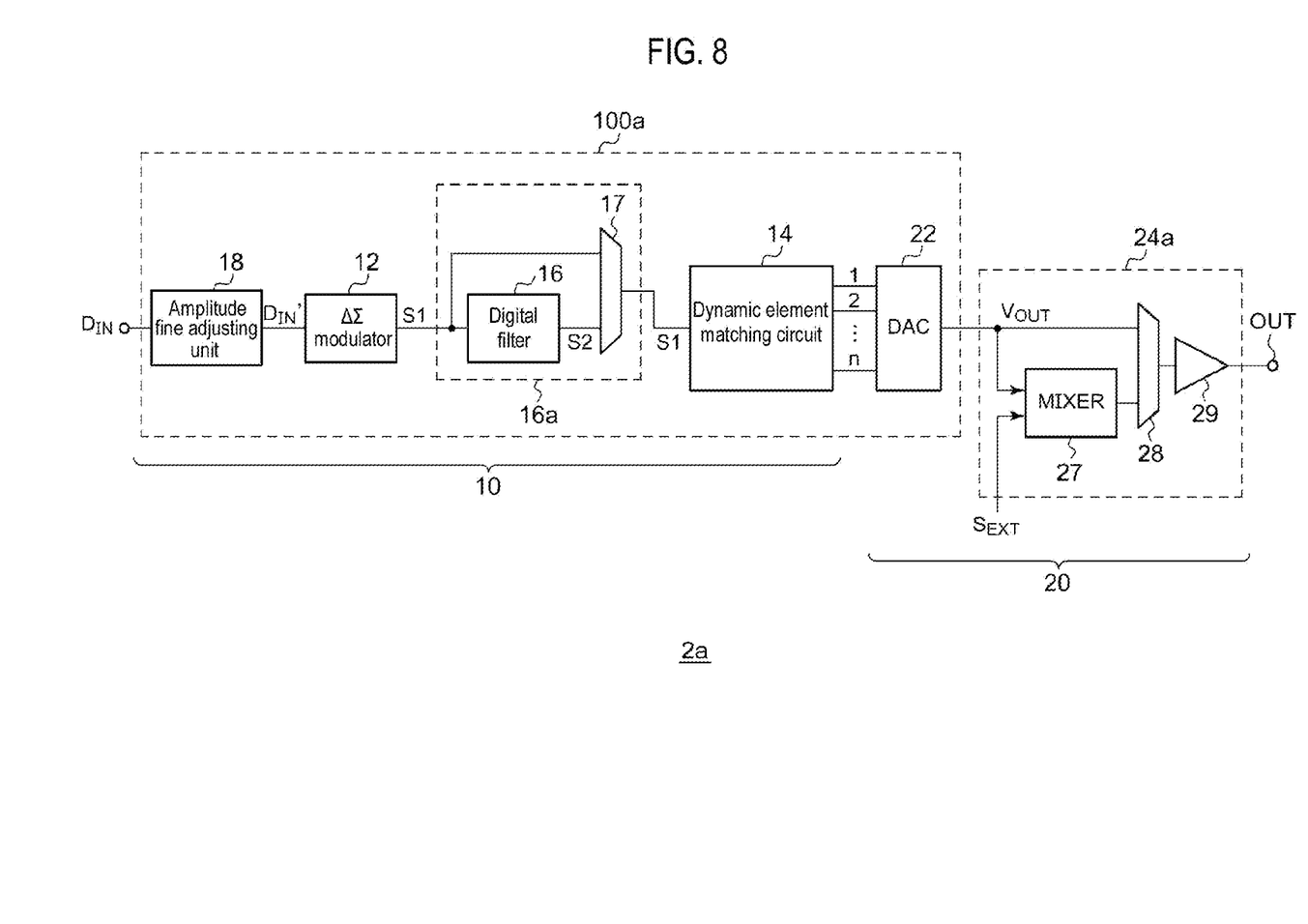
FIG. 8 is a block diagram of a signal processing circuit according to a first modification.

FIG. 8 is a block diagram of a signal processing circuit 2a according to a first modification. In the signal processing circuit 2a, an analog signal processing circuit 24a of analog part 20 in the subsequent stage of a ΔΣ D/A converter 100a has a plurality of switchable paths.

For example, the analog signal processing circuit 24a includes a mixer circuit 27, a selector 28 and a driver 29. The mixer circuit 27 mixes an analog audio signal $S_{ExT}$ to an output signal of the ΔΣ D/A converter 100a. The selector 28 selects one of a signal output from the mixer circuit 27 and an output of the D/A converter 22. The driver 29 processes an output signal of the selector 28.

A signal path which does not include the mixer circuit 27 and a signal path which includes the mixer circuit 27 have different noise levels. Specifically, the noise level of the former is decreased. When the noise level of the analog signal processing circuit 24a is small, deterioration of the theoretical S/N ratio due to the peak cut by the digital filter 16 becomes remarkable.

Then, the signal processing circuit 2a is configured to switch between a state of the signal processing circuit 2 of FIG. 3 and a state of the signal processing circuit 2r of FIG. 1A. Specifically, a digital filter 16a may switch between an active state and an inactive state. In the inactive state, the digital filter 16a may output the first data S1 intact as the second data S2. For example, the digital filter 16a includes the above-described digital filter 16 and a selector 17. The selector 17 selects an output of the digital filter 16 in the active state and selects an output of the ΔΣ modulator 12 in the inactive state.

The configuration of the digital filter 16a is not limited to that shown in FIG. 8. For example, the number of stages of the FIR filter shown in FIG. 4B may be changed. When the number of stages is 1, the digital filter 16a may be configured to be inactive.

In addition, the quantizer 34 at the output stage of the ΔΣ modulator 12 is configured so that the number of gradation levels thereof may be changed in association with the state of the digital filter 16a. That is, the gradation levels of the quantizer 34 range from 0 to n when the digital filter 16a is inactive, while ranging from 0 to m when the digital filter 16a is active.

The gain β of the amplitude fine adjusting unit 18 may be also changed in association with the state of the digital filter 16a. For example, the gain β may be 1 when the digital filter 16a is inactive.

The configuration of the signal processing circuit 2a has been described above. Here, it is assumed that a noise level of the path which includes the mixer circuit 27 is −98.1 [dBv] and a noise level of the path which does not include the mixer circuit 27 is −101.1 [dBv].

When the path which includes the mixer circuit 27 is selected, the digital filter 16a becomes active and the number of gradation levels of the quantizer 34 becomes m. Accordingly, the S/N ratio of the entire signal processing circuit 2a is 97.3 [dB], which is larger than the S/N ratio of 96 [dB] when the digital filter 16a is inactive, like the embodiment.

On the other hand, when the path which does not include the mixer circuit 27 is selected, if the signal processing circuit 2a operates with the digital filter 16a in the active state and the number of gradation levels of the quantizer 34 as m, as shown in FIG. 3, the S/N ratio of the entire signal processing circuit 2a is 98 [dB]. In contrast, if the signal processing circuit 2a operates with the digital filter 16a in the inactive state and the number of gradation levels of the quantizer 34 as n, as shown in FIG. 1A, the S/N ratio of the entire signal processing circuit 2a is 99 [dB].

According to this modification, by switching the operations of the digital filter 16 and the ΔΣ modulator 12, it is possible to realize a high S/N ratio in various circumferences where noise levels of the analog part 20 are different.

(Second Modification)

Although it has been described in the above embodiment that the gain a of the digital filter 16 has substantially the precision of integer and the gain β of the amplitude fine adjusting unit 18 has the precision of decimal, the present disclosure is not limit thereto. When the digital filter 16 is a FIR filter, the gain α may have a precision of decimal by setting a coefficient of each stage with a precision of decimal. In this case, the amplitude fine adjusting unit 18 may be omitted. In addition, the digital filter 16 is not limited to the FIR filter, but may be other types of filters.

(Third Modification)

The gain α of the digital filter 16, in other words, the number k of stages of the FIR filter, may be configured to be switchable among multiple values, according to which the number m of gradation levels of the quantizer 34 of the ΔΣ modulator 12 may be also configured to be switchable. Thus, it is allowed to improve the S/N ratio in a more flexible manner.

(Fourth Modification)

Although it has been described in the above embodiment that the D/A converter 22 is of a switched capacitor type, the present disclosure is not limited thereto. For example, the D/A converter 22 may be a D/A converter of a current segment type shown in FIG. 1C. That is, the D/A converter 22 may be a type that includes a plurality of equally weighted circuit elements and outputs a voltage or a current corresponding to a number of selected circuit elements.

INDUSTRIAL APPLICABILITY

Figure 9:
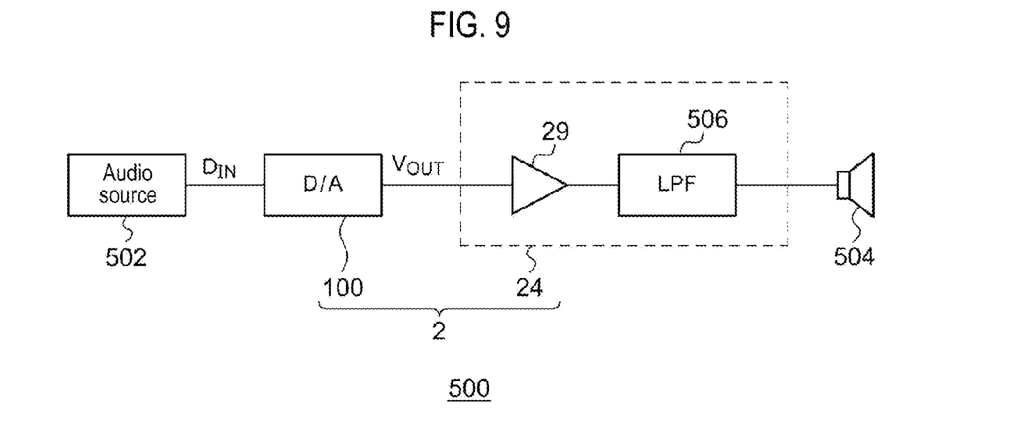
FIG. 9 is a block diagram of an electronic apparatus including the signal processing circuit.

Finally, an application of the signal processing circuit 2 will be described. FIG. 9 is a block diagram of an electronic apparatus 500 including the signal processing circuit 2. The electronic apparatus 500 is an apparatus with an audio playback function, such as a mobile phone, a tablet terminal, an audio player, an audio component, a car audio system or the like. The electronic apparatus 500 includes an audio source 502 and an electro-acoustic transducer 504 in addition to the signal processing circuit 2. The audio source 502 generates a digital audio signal $D_{IN}$.

The signal processing circuit 2 includes a ΔΣ D/A converter 100 and an analog signal processing circuit 24. The analog signal processing circuit 24 includes a driver 29 and an analog filter 506. The ΔΣ D/A converter 100 receives the digital audio signal $D_{IN}$ and converts it to an analog audio signal $V_{OUT}$. The driver 29 of the analog signal processing circuit 24 drives the electro-acoustic transducer 504, such as a speaker, a headphone or the like, based on the analog audio signal $V_{OUT}$. The filter 506 removes noises from an output signal of the driver 29.

By applying the signal processing circuit 2 to the electronic apparatus 500, it is possible to achieve high quality audio playback with a higher S/N ratio.

The object to be processed by the signal processing circuit 2 is not limited to the audio signal and its application is not limited to the electronic apparatus with the audio playback function. For example, the signal processing circuit 2 may be applied not only to an apparatus providing a signal processing with a higher S/N ratio, but also to a measuring instrument and the like requiring a high precision.

According to the present disclosure in some embodiments, it is possible to improve an S/N ratio.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A ΔΣ D/A converter for converting a digital input data to an analog output signal, comprising:
   a ΔΣ modulator configured to generate a first data by ΔΣ-modulating the digital input data;
   a digital filter configured to generate a second data by smoothing the first data, wherein the smoothing includes removing a peak of the first data;
   a D/A converter configured to convert the second data to the analog output signal; and
   an amplitude fine adjusting unit, provided in a front stage of the ΔΣ modulator, configured to finely adjust an amplitude of the digital input data by multiplying the digital input data by a gain of the amplitude fine adjusting unit,
   wherein the digital filter is configured to be switchable between an active state and an inactive state and, if the digital filter is switched to the inactive state, the digital filter outputs the first data as the second data,
   wherein the ΔΣ modulator includes a quantizer provided in an output stage of the ΔΣ modulator, the quantizer being configured so that a number of gradation levels of the quantizer is changed, depending on a state of the digital filter, and
   wherein, when the digital filter is switched to the active state, the amplitude fine adjusting unit magnifies the gain of the amplitude fine adjusting unit in accordance with the peak removed by the digital filter.

2. The ΔΣ D/A converter of claim 1, wherein the digital filter includes a FIR digital filter with k stages, each of which has a coefficient of 1.

3. The ΔΣ D/A converter of claim 2, wherein a number of stages of the FIR digital filter is changeable.

4. The ΔΣ D/A converter of claim 1, wherein a plurality of selectable analog signal paths is provided in a subsequent stage of the ΔΣ D/A converter, and
   wherein an operation of the digital filter varies depending on a selected path among the plurality of selectable analog signal paths.

5. The ΔΣ D/A converter of claim 1, wherein the digital input data is an audio signal.

6. A signal processing circuit comprising:
   a ΔΣ converter configured to convert a digital audio signal to an analog audio signal, and
   an analog signal processing circuit configured to subject an output signal of the ΔΣ D/A converter to a predetermined signal processing,
   wherein the ΔΣ D/A converter includes:
   a ΔΣ modulator configured to generate a first data by ΔΣ-modulating the digital input data;
   a digital filter configured to generate a second data by smoothing the first data, wherein the smoothing includes removing a peak of the first data;
   a D/A converter configured to convert the second data to the analog output signal; and
   an amplitude fine adjusting unit, provided in a front stage of the ΔΣ modulator, configured to finely adjust an amplitude of the digital input data by multiplying the digital input data by a gain of the amplitude fine adjusting unit,
   wherein the digital filter is configured to be switchable between an active state and an inactive state and, if the digital filter is switched to the inactive state, the digital filter outputs the first data as the second data,
   wherein the ΔΣ modulator includes a quantizer provided in an output stage of the ΔΣ modulator, the quantizer being configured so that a number of gradation levels of the quantizer is changed, depending on a state of the digital filter, and
   wherein, when the digital filter is switched to the active state, the amplitude fine adjusting unit magnifies the gain of the amplitude fine adjusting unit in accordance with the peak removed by the digital filter.

7. The signal processing circuit of claim 6, comprising a plurality of selectable analog signal paths,
   wherein an operation of the ΔΣ D/A converter varies depending on a selected path among the plurality of selectable analog signal paths.

8. An electronic apparatus comprising a signal processing circuit, the signal processing circuit comprising:
   a ΔΣ D/A converter configured to convert a digital audio signal to an analog audio signal, and
   an analog signal processing circuit configured to subject an output signal of the ΔΣ D/A converter to a predetermined signal processing,
   wherein the ΔΣ D/A converter includes:
   a ΔΣ modulator configured to generate a first data by ΔΣ-modulating the digital input data;
   a digital filter configured to generate a second data by smoothing the first data, wherein the smoothing includes removing a peak of the first data;
   a D/A converter configured to convert the second data to the analog output signal; and
   an amplitude fine adjusting unit, provided in a front stage of the ΔΣ modulator, configured to finely adjust an amplitude of the digital input data by multiplying the digital input data by a gain of the amplitude fine adjusting unit,
   wherein the digital filter is configured to be switchable between an active state and an inactive state and, if the digital filter is switched to the inactive state, the digital filter outputs the first data as the second data,
   wherein the ΔΣ modulator includes a quantizer provided in an output stage of the ΔΣ modulator, the quantizer being configured so that a number of gradation levels of the quantizer is changed, depending on a state of the digital filter, and
   wherein, when the digital filter is switched to the active state, the amplitude fine adjusting unit magnifies the gain of the amplitude fine adjusting unit in accordance with the peak removed by the digital filter.

* * * * *